(12) United States Patent
You et al.

(10) Patent No.: US 10,134,956 B2
(45) Date of Patent: Nov. 20, 2018

(54) LIGHT EMITTING DIODE AND MANUFACTURING METHOD THEREOF

(71) Applicant: Seoul Viosys Co., Ltd., Ansan-si (KR)

(72) Inventors: Jong Kyun You, Ansan-si (KR); Da Hye Kim, Ansan-si (KR); Chang Ik Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/503,963

(22) PCT Filed: Aug. 24, 2015

(86) PCT No.: PCT/KR2015/008839
§ 371 (c)(1),
(2) Date: Feb. 14, 2017

(87) PCT Pub. No.: WO2016/032192
PCT Pub. Date: Mar. 3, 2016

(65) Prior Publication Data
US 2017/0279008 A1    Sep. 28, 2017

(30) Foreign Application Priority Data

Aug. 27, 2014  (KR) ................. 10-2014-0112448
Aug. 18, 2015  (KR) ................. 10-2015-0116053

(51) Int. Cl.
  *H01L 33/60*    (2010.01)
  *H01L 33/62*    (2010.01)
  (Continued)

(52) U.S. Cl.
  CPC ........ *H01L 33/405* (2013.01); *H01L 33/0079* (2013.01); *H01L 33/16* (2013.01);
  (Continued)

(58) Field of Classification Search
  None
  See application file for complete search history.

(56) References Cited

U.S. PATENT DOCUMENTS

| 2009/0134410 | A1  | 5/2009 | Paek et al. |
| 2013/0146907 | A1* | 6/2013 | Lunev ............... H01L 33/32 |
| | | | 257/94 |

(Continued)

FOREIGN PATENT DOCUMENTS

| JP | 2014-116439 | * | 6/2014 |
| KR | 10-0935974 | | 1/2010 |

(Continued)

OTHER PUBLICATIONS

Ko et al., "Study on optimal growth conditions of a-plane GaN grown on r-plane sapphire by metal-organic chemical vapor deposition," 2007, Journal of Crystal Growth, 300, pp. 308-313.*

(Continued)

*Primary Examiner* — Duy T Nguyen
*Assistant Examiner* — Bo Bin Jang
(74) *Attorney, Agent, or Firm* — H.C. Park & Associates, PLC

(57) ABSTRACT

A light emitting diode includes a support substrate; a light emitting structure including a second semiconductor layer, an active layer, and a first semiconductor layer; at least one groove formed on the lower surface of the light emitting structure; a second electrode located on at least the lower surface of the second semiconductor layer, and electrically connected with the second semiconductor layer; an insulating layer partially covering the second electrode and the lower surface of the light emitting structure, and including at least one opening corresponding to the at least one groove; and a first electrode electrically connected to the first semiconductor layer exposed to the at least one groove, and at least partially covering the insulating layer, wherein the (Continued)

second electrode includes a second contact layer including an ohmic contact layer, and the ohmic contact layer is disposed in the shape of a plurality of islands.

9 Claims, 11 Drawing Sheets

(51) Int. Cl.
*H01L 33/20* (2010.01)
*H01L 33/38* (2010.01)
*H01L 33/40* (2010.01)
*H01L 33/00* (2010.01)
*H01L 33/16* (2010.01)
*H01L 33/44* (2010.01)
*H01L 33/48* (2010.01)
*H01L 33/54* (2010.01)
*H01L 33/22* (2010.01)

(52) U.S. Cl.
CPC .............. *H01L 33/20* (2013.01); *H01L 33/38* (2013.01); *H01L 33/382* (2013.01); *H01L 33/62* (2013.01); *H01L 33/22* (2013.01); *H01L 2933/0016* (2013.01); *H01L 2933/0033* (2013.01); *H01L 2933/0066* (2013.01)

(56) References Cited

U.S. PATENT DOCUMENTS

| | | |
|---|---|---|
| 2013/0214308 A1 | 8/2013 | Lee et al. |
| 2014/0131731 A1 | 5/2014 | Kim et al. |
| 2014/0183546 A1 | 7/2014 | Kim et al. |
| 2014/0319455 A1* | 10/2014 | Miyachi ................. H01L 33/06 257/13 |

FOREIGN PATENT DOCUMENTS

| | | |
|---|---|---|
| KR | 10-2014-0060149 | 5/2014 |
| KR | 10-2014-0086624 | 7/2014 |

OTHER PUBLICATIONS

International Search Report dated Nov. 27, 2015 in PCT/KR2015/008839.

\* cited by examiner

FIG. 15A
FIG. 15B
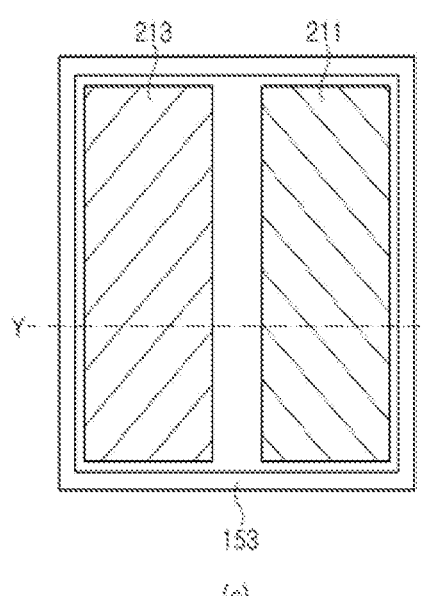
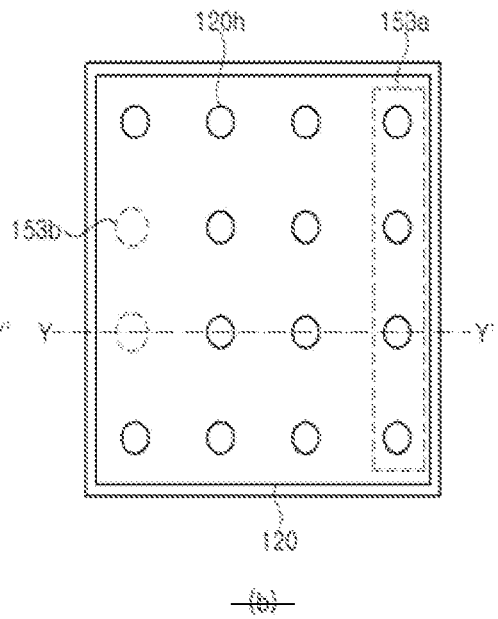
FIG. 16
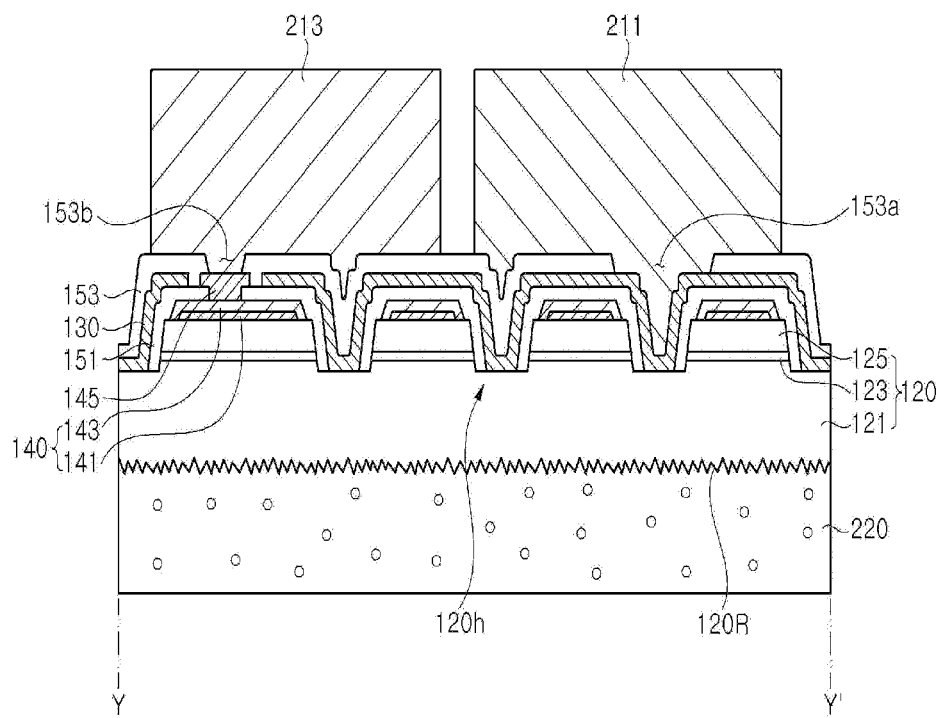

LIGHT EMITTING DIODE AND MANUFACTURING METHOD THEREOF

CROSS REFERENCE TO RELATED APPLICATION

This application is the National Stage Entry of International Application No. PCT/KR2015/008839, filed on Aug. 24, 2015, and claims priority from Korean Patent Application No. 10-2014-0112448, filed on Aug. 27, 2014 and Korean Patent Application No. 10-2015-0116053, filed on Aug. 18, 2015, each of which is incorporated herein by reference for all purposes as if fully set forth herein.

BACKGROUND

Field

Exemplary embodiments of the present disclosure relate to a light emitting diode and a method of manufacturing the same, and more particularly, to a light emitting diode that has low contact resistance between a semiconductor layer having a non-polar or semi-polar growth plane and an electrode, and a method of manufacturing the same.

Discussion of the Background

Recently, with increasing demand for high output light emitting diodes, there is increasing demand for vertical light emitting diodes having good heat dissipation efficiency and luminous efficacy. For a vertical light emitting diode, a growth substrate is separated from semiconductor layers to improve light extraction efficiency by increasing roughness of a separated surface and a metal substrate is attached to an overall upper surface of a P-type semiconductor layer in order to improve heat dissipation efficiency. With this structure, the vertical type light emitting diode can be applied to high output light emitting diodes driven at high current density.

Generally, a light exit surface of the vertical type light emitting diode is present on one surface of an n-type semiconductor layer exposed due to separation of the growth substrate. A surface of the p-type semiconductor layer opposite the light exit surface is formed with components for reflecting light, for example, a reflective electrode layer such as an Ag layer. Japanese Unexamined Patent Publication No. 2010-56423 discloses a technology in which heat treatment is performed in order to reduce contact resistance of the Ag layer while maintaining reflection characteristics thereof.

Recently, output and reliability requirements of light emitting diodes used in various applications are much higher than those of typical light emitting diodes. Accordingly, research and development of techniques for manufacturing a vertical light emitting diode by growing nitride semiconductor layers on a growth substrate having a non-polar or semi-polar growth plane are actively conducted. Such vertical light emitting diodes having nonpolar or semi-polar growth planes exhibit low efficiency drooping compared with light emitting diodes having polar growth planes and thus are suitable for high power light emitting diodes.

However, in a nitride semiconductor layer grown on such a nonpolar or semi-polar growth plane, contact resistance of a reflective electrode including a P-type semiconductor layer and Ag is much higher than that of a nitride semiconductor layer grown on the C-plane. Moreover, when heat treatment disclosed in Japanese Unexamined Patent Publication No 2010-56423 and the like is performed on the reflective electrode in order to lower contact resistance, reflection characteristics are deteriorated, thereby causing significant deterioration in luminous efficacy of the light emitting diode.

SUMMARY

Exemplary embodiments of the present disclosure provide a light emitting diode that includes a contact electrode having improved electrical and optical characteristics, and a method of manufacturing the same.

In accordance with one aspect of the present disclosure, a light emitting diode includes: a support substrate; a light emitting structure disposed on the support substrate and having a non-polar or semi-polar growth plane, the light emitting structure including a second conductive type semiconductor layer, an active layer disposed on the second conductive type semiconductor layer, and a first conductive type semiconductor layer disposed on the active layer; at least one groove formed on a lower surface of the light emitting structure and partially exposing the first conductive type semiconductor layer; a second type electrode disposed at least on a lower surface of the second conductive type semiconductor layer and electrically connected to the second conductive type semiconductor layer; an insulation layer partially covering the second type electrode and the lower surface of the light emitting structure, and including at least one opening corresponding to the at least one groove; and a first type electrode electrically connected to the first conductive type semiconductor layer exposed to the groove and at least partially covering the insulation layer, wherein the second type electrode includes a second type contact layer contacting the second conductive type semiconductor layer, and the second type contact layer includes an ohmic contact layer, the ohmic contact layer being composed of a plurality of regular or irregular islands.

With this structure, the light emitting diode can have low contact resistance between the electrode and the semiconductor layer and can provide good luminous efficacy.

The ohmic contact layer may include at least one material selected from the group consisting of Ni, Pt, Mg, Ni/Au, and a conductive oxide.

The second type contact layer may further include a reflective layer covering the ohmic contact layer, and the reflective layer may include Ag and/or Al.

The second type electrode may further include a second type barrier layer at least partially covering the second type contact layer, and a portion of the second type barrier layer may extend from one side surface of the light emitting structure to be exposed at an upper surface thereof.

Some portion of a lower surface of the second type contact layer may be covered by the second type barrier layer and the other portion of the lower surface of the second type contact layer may be covered by the insulation layer.

At least part of the portion of the insulation layer covering the lower surface of the second type contact layer may be interposed between the second type barrier layer and the second type contact layer.

The light emitting diode may further include a second type pad electrode electrically connected to the second type barrier layer and formed in a region to which the upper surface of the second type barrier layer is exposed, and a lower surface of the second type pad electrode may at least partially contact the second type barrier layer.

The first type electrode may include a first type contact layer contacting the first conductive type semiconductor layer and a first type barrier layer at least partially covering the first type contact layer.

The first type contact layer may cover a lower surface of the insulation layer.

The first type contact layer may fill the at least one opening and may not be disposed on the lower surface of the second conductive type semiconductor layer.

The light emitting diode may further include a bonding layer bonding the support substrate to the second type electrode.

In accordance with another aspect of the present disclosure, a method of manufacturing a light emitting diode may include: forming a light emitting structure on a growth substrate having a non-polar or semi-polar growth plane, the light emitting structure including a first conductive type semiconductor layer, an active layer disposed on the first conductive type semiconductor layer, and a second conductive type semiconductor layer disposed on the active layer; removing a portion of the light emitting structure so as to form at least one groove partially exposing the first conductive type semiconductor layer, while forming a second type electrode on the second conductive type semiconductor layer; forming an insulation layer covering the light emitting structure and the second type electrode and including at least one opening corresponding to the groove; forming a first type electrode electrically connected to the first conductive type semiconductor layer through the opening and at least partially covering the insulation layer; forming a support substrate on the first type electrode; and separating the growth substrate from the light emitting structure, wherein forming the second type electrode includes forming a second type contact layer including an ohmic contact layer, and the ohmic contact layer contacts the second conductive type semiconductor layer and is formed in a pattern of a plurality of regular or irregular islands through deposition and/or patterning.

The ohmic contact layer may include at least one material selected from the group consisting of Ni, Pt, Mg, Au/Ni, and a conductive oxide.

Forming the second type contact layer may further include forming a reflective layer covering the ohmic contact layer, and the reflective layer may include Ag and/or Al.

Forming the second type electrode may further include a second type barrier layer at least partially covering the second type contact layer.

The method of manufacturing a light emitting diode may further include partially removing the light emitting structure so as to expose a portion of the second type barrier layer after separation of the growth substrate.

The method of manufacturing a light emitting diode may further include forming a second type pad electrode on at least some portion in a region, to which the second type barrier layer is partially exposed, so as to be electrically connected to the second type barrier layer.

Forming the first type electrode may include forming a first type contact layer filling the opening while at least partially covering the insulation layer; and forming a first type barrier layer on the first type contact layer.

The method of manufacturing a light emitting diode may further include forming a bonding layer on the second type electrode to bond the support substrate to the second type electrode, before separation of the growth substrate.

The method of manufacturing a light emitting diode may further include forming a roughness on a surface of the first conductive type semiconductor layer exposed by separation of the growth substrate, and forming the roughness may be performed using dry etching.

In accordance with a further aspect of the present disclosure, a light emitting diode includes: a light emitting structure including a first conductive type semiconductor layer, a second conductive type semiconductor layer, and an active layer interposed between the first conductive type semiconductor layer and the second conductive type semiconductor layer, the light emitting structure having at least one groove formed through the second conductive type semiconductor layer and the active layer to expose a portion of the first conductive type semiconductor layer, the light emitting structure having a non-polar or semi-polar growth plane; a first type electrode and a second type electrode disposed on the light emitting structure and forming ohmic contact with the first and second conductive type semiconductor layers, respectively; an insulation layer insulating the first type electrode and the second type electrode from each other, and including a first opening and a second opening exposing the first type electrode and the second type electrode, respectively; and a first electrode pad and a second electrode pad disposed on the insulation layer and electrically connected to the first type electrode and the second type electrode, respectively, wherein the second type electrode includes a second type contact layer contacting the second conductive type semiconductor layer, the second type contact layer includes an ohmic contact layer, and the ohmic contact layer is formed in a pattern of a plurality of regular or irregular islands.

The ohmic contact layer may include at least one material selected from the group consisting of Ni, Pt, Mg, Ni/Au, and a conductive oxide.

The second type contact layer may further include a reflective layer covering the ohmic contact layer, and the reflective layer may include Ag and/or Al.

The light emitting structure may include a plurality of grooves and the second opening may not be disposed above the plurality of grooves.

According to exemplary embodiments of the present disclosure, the light emitting diode has a non-polar or semi-polar growth plane to secure low forward voltage by securing low contact resistance between a second type electrode and a second conductive type semiconductor layer while securing good luminous efficacy.

BRIEF DESCRIPTION OF THE DRAWINGS

The above and other aspects, features and advantages of the present invention will be more clearly understood from the following detailed description taken in conjunction with the accompanying drawings, in which:

FIG. 15A and FIG. 15B plan views a light emitting diode according to another exemplary embodiment of the present disclosure.

FIG. 16 is a sectional view taken along line Y-Y' of FIG. 15A.

DETAILED DESCRIPTION OF THE ILLUSTRATED EMBODIMENTS

Figure 1:
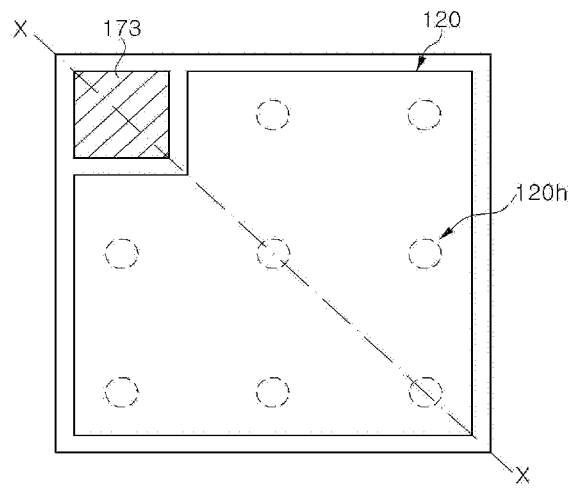
FIG. 1 is a plan view a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

Figure 2A:
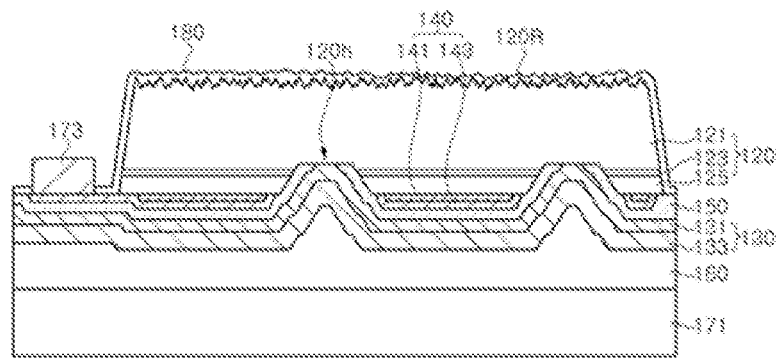
FIG. 2A is a cross-sectional view taken along line X-X of FIG. 1 according to an exemplary embodiment.
Figure 2B:
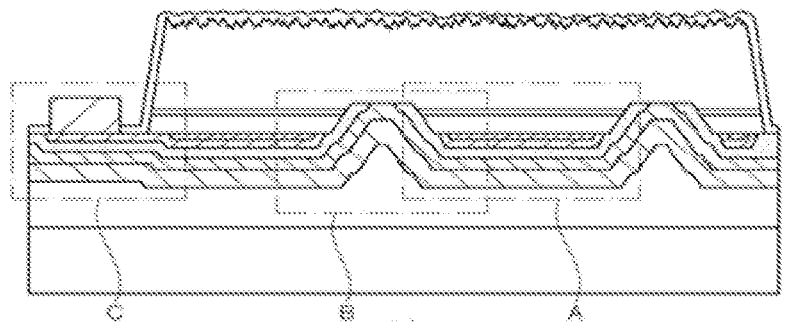
FIG. 2B is a cross-sectional view taken along line X-X of FIG. 1 according to an exemplary embodiment.

FIG. 1 is a plan view of a light emitting diode according to one exemplary embodiment of the present disclosure. FIG. 2A is a cross-sectional view taken along line X-X of FIG. 1. In addition, FIG. 2B is a cross-sectional view taken along line X-X of FIG. 1 showing regions A, B, and C. Region A of FIG. 2B corresponds to enlarged sectional views of FIGS. 3A, 3B, 3C, 4A, 4B, and 4C. Region B of FIG. 2B corresponds to enlarged sectional views of FIGS. 5A and 5B. Region C of FIG. 2B corresponds to enlarged sectional views of FIGS. 6A and 6B.

Referring to FIG. 1 and FIG. 2, a light emitting diode according to one exemplary embodiment includes a light emitting structure 120, at least one groove 120h, a first type electrode 130, a second type electrode 140, and an insulation layer 150. The light emitting diode may further include a bonding layer 160, a support substrate 171, a second type pad electrode 173, and a passivation layer 180.

The light emitting structure 120 may include a first conductive type semiconductor layer 121, an active layer 123, and a second conductive type semiconductor layer 125, in which the first conductive type semiconductor layer 121 is disposed on the second conductive type semiconductor layer 125 and the active layer 123 is interposed between the first and second conductive type semiconductor layers 121, 125. The light emitting structure 120 may further include a roughness 120R formed on an upper surface thereof.

The first conductive type semiconductor layer 121 and the second conductive type semiconductor layer 125 may include a Group III-V compound semiconductor, for example, a nitride semiconductor such as (Al, Ga, In)N. The first conductive type semiconductor layer 121 may include an n-type semiconductor layer doped with n-type dopants (for example, Si) and the second conductive type semiconductor layer 125 may include a p-type semiconductor layer doped with p-type dopants (for example, Mg), or vice versa. Furthermore, the first conductive type semiconductor layer 121 and/or the second conductive type semiconductor layer 125 may be composed of a single layer or multiple layers. For example, the first conductive type semiconductor layer 121 and/or the second conductive type semiconductor layer 125 may include a clad layer and a contact layer, and may include super-lattice layers.

The active layer 123 may include a multi-quantum well (MQW) structure, and elements and composition of the multi-quantum well structure can be adjusted to allow the multi-quantum well structure to emit light having a desired peak wavelength. For example, well layers of the active layer 123 may be ternary semiconductor layers such as $In_xGa_{(1-x)}N$ ($0 \leq x \leq 1$) or quaternary semiconductor layers such as $Al_xIn_yGa_{(1-x-y)}N(0 \leq x \leq 1, 0 \leq y \leq 1, 0 \leq x+y \leq 1)$, and the value of x or y may be adjusted in order to allow the active layer to emit light having a desired wavelength. It should be understood that other implementations are also possible.

The light emitting structure 120 may be grown on the growth substrate having a non-polar or semi-polar growth plane. Thus, the light emitting structure 120 including the first conductive type semiconductor layer 121, the active layer 123 and the second conductive type semiconductor layer 125 may have a non-polar or semi-polar growth plane. The non-polar growth plane may include the m-plane or the a-plane.

A surface of the light emitting structure 120, that is, an upper surface of the first conductive type semiconductor layer 121, may be formed with a roughness 120R. The roughness 120R may be formed by performing surface treatment on the surface of the first conductive type semiconductor layer 121 using at least one of various methods such as dry etching, wet etching, and electro-chemical etching. With the roughness 120R, the light emitting diode can improve extraction efficiency of light emitted through an upper surface thereof.

At least one groove 120h may be formed on a lower surface of the light emitting structure 120 and may be formed in plural, as shown in the drawings. The at least one groove 120h may be formed by removing some regions of the lower surface of the light emitting structure 120, and the first conductive type semiconductor layer 121 may be exposed through the groove 120h. Further, the second conductive type semiconductor layer 125 and the active layer 123 may be exposed to a side surface of the groove 120h, and the side surface of the groove 120h may be an inclined side surface. Since the grooves 120h have an inclined side surface, the first type electrode 130 and the insulation layer 150 disposed on the side surface of the groove 120h can have improved step coverage characteristics.

When the groove 120h is composed of a plurality of grooves, the shape of the grooves 120h may be modified in various ways. As described below, since the first type electrode 130 is electrically connected to the first conductive type semiconductor layer 121 through the grooves 120h, the arrangement of the grooves 120h may be modified in various ways in consideration of current dispersion and density of electric current upon driving of the light emitting diode. For example, the grooves 120h may be arranged in the form of plural dots, plural stripes, or combinations thereof. However, it should be understood that other implementations are also possible.

The second type electrode 140 may be disposed at least on a lower surface of the second conductive type semiconductor layer 125 and may be electrically connected to the second conductive type semiconductor layer 125, and some the second type electrode 140 may extend from a side surface of the light emitting structure 120 such that an upper surface thereof can be exposed. In addition, the second type electrode 140 may include a second type contact layer 141 and a second type barrier layer 143.

The second type contact layer 141 is disposed on the lower surface of the second conductive type semiconductor layer 125, whereby the second type contact layer 141 can form ohmic contact with the second conductive type semiconductor layer 125. In addition, the second type contact layer 141 may include an ohmic contact layer and a reflective layer covering the ohmic contact layer. When the second conductive type semiconductor layer 125 is a p-type semiconductor layer, the ohmic contact layer may include a material that forms ohmic contact with the second conductive type semiconductor layer 125 having a non-polar or semi-polar growth plane, and the reflective layer may have light reflectivity and may also include a material that forms ohmic contact with the second conductive type semiconductor layer 125.

Here, contact resistance between the ohmic contact layer and the second conductive type semiconductor layer 125 may be lower than the contact resistance between the reflective layer and the second conductive type semiconductor layer 125. Accordingly, the contact resistance between the second type electrode 140 and the second conductive type semiconductor layer 125 can be lowered. In this regard, various exemplary embodiments of the present disclosure will now be described in detail with reference to FIG. 3A and FIG. 3B.

Figure 3A:
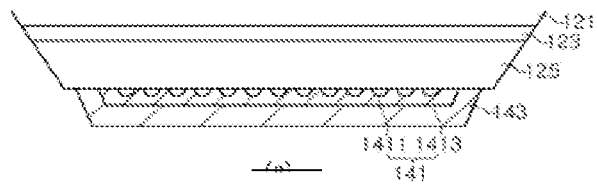
FIG. 3A is an enlarged sectional view of a second type contact layer according to exemplary embodiments of the present disclosure.
Figure 3B:
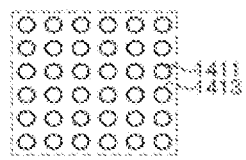
FIG. 3B is a plan view of the second type contact layer of FIG. 3A.
Figure 3C:
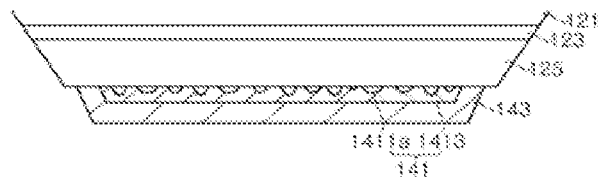
FIG. 3C is an enlarged sectional view of a second type contact layer according to exemplary embodiments of the present disclosure.
Figure 3D:
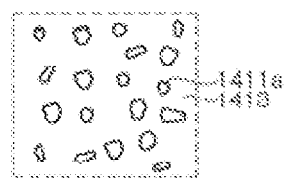
FIG. 3D is a plan view of the second type contact layer of FIG. 3C.
Figure 3E:
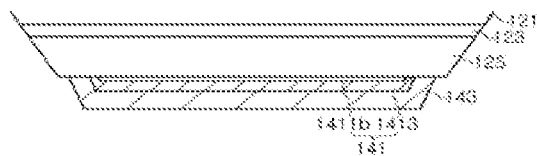
FIG. 3E is an enlarged sectional view of a second type contact layer according to exemplary embodiments of the present disclosure.
Figure 3F:
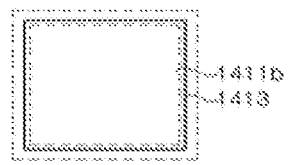
FIG. 3F is a plan view of the second type contact layer of FIG. 3E.

FIG. 3A is an enlarged sectional view of a second type contact layer according to exemplary embodiments of the present disclosure. FIG. 3B is a plan view of the second type contact layer of FIG. 3A. FIG. 3C is an enlarged sectional view of a second type contact layer according to exemplary embodiments of the present disclosure. FIG. 3D is a plan view of the second type contact layer of FIG. 3C. FIG. 3E is an enlarged sectional view of a second type contact layer according to exemplary embodiments of the present disclosure. FIG. 3F is a plan view of the second type contact layer of FIG. 3E. FIGS. 3A, 3C, and 3E are each a sectional view of Region A of FIG. 2B. FIGS. 3B, 3D, and 3F are each a schematic plan view of a portion of the second type contact layer 141.

First, referring to FIGS. 3A and 3B, the second type contact layer 141 may include an ohmic contact layer 1411 and a reflective layer 1413 covering the ohmic contact layer 1411.

The ohmic contact layer 1411 forms ohmic contact with the second conductive type semiconductor layer 125 having a non-polar or semi-polar growth plane, and may include a material having low contact resistance. For example, the ohmic contact layer 1411 may include a material selected from the group consisting of Ni, Pt, Mg, Ni/Au, a conductive oxide, and some combination thereof. The conductive oxide may include ITO, IZO, IZTO, IAZO, IGZO, IGTO, AZO, $IrO_x$, $RuO_x$, $RuO_x$/ITO, MgO, ZnO, and the like. In addition, the ohmic contact layer 1411 may be formed in a pattern of plural regular islands, as shown in the drawings. Here, the ohmic contact layer 1411 of each island may have a semispherical shape.

However, it should be understood that other implementations are also possible. Alternatively, the ohmic contact layer may have a different shape from the shape shown in FIGS. 3C, 3D, 3E, and 3F. As shown in FIGS. 3C and 3D, the ohmic contact layer 1411a may have a pattern of a plurality of irregular islands, each of which may have a different shape and size than other islands. Alternatively, as shown in FIGS. 3E and 3F, the ohmic contact layer 1411b may be formed in the form of a monolithic film.

The reflective layer 1413 may be formed to cover the ohmic contact layer 1411 and at least part of the reflective layer 1413 may contact the second conductive type semiconductor layer 125. The reflective layer 1413 may include a material, for example, Ag and/or Al, which has high reflectivity with respect to light, exhibits electrical conductivity, and can form ohmic contact with the second conductive type semiconductor layer 125. The reflective layer 1413 is formed on the lower surface of the second conductive type semiconductor layer 125, whereby light emitted from the light emitting structure 120 can be reflected toward an upper side of the light emitting diode, thereby improving luminous efficacy of the light emitting diode.

According to exemplary embodiments, the ohmic contact layer 1411 interposed between the reflective layer 1413 and the second conductive type semiconductor layer 125 may be formed to reduce contact resistance between the second electrode 140 and the second conductive type semiconductor layer 125. In addition, as compared with a structure where only the reflective layer 1413 is provided, the ohmic contact layer 1411 relatively reduces a contact area between the reflective layer 1413 and the second conductive type semiconductor layer 125. Thus, even without reducing the contact resistance between the reflective layer 1413 and the second conductive type semiconductor layer 125 as in the related art, the forward voltage Vf of the light emitting diode can be reduced by lowering the contact resistance between the second type contact layer 141 and the second conductive type semiconductor layer 125. Furthermore, since the ohmic contact layer 1411 allows heat treatment to be performed at low temperature or to be omitted in order to reduce the contact resistance of the reflective layer 1413, it is possible to prevent a decrease in reflectance of the reflective layer 1413 due to heat treatment.

Referring again to FIG. 1 and FIGS. 2A and 2B, the second type barrier layer 143 is disposed on the lower surface of the second conductive type semiconductor layer 125 and may at least partially cover the second type contact layer 141. In addition, the second type barrier layer 143 may be integrally formed under a region excluding the at least one groove 120h. Further, a portion of the second type barrier layer 143 may extend from a side surface of the light emitting structure 120 so as to be exposed, instead of being disposed under the light emitting structure 120.

The second type barrier layer 143 can prevent diffusion between the second type contact layer 141 and other materials. Accordingly, it is possible to prevent the second type contact layer 141 from suffering from reflectance deterioration and resistance increase due to diffusion of other materials into the second type contact layer 141. In addition, the second type barrier layer 143 may act as a secondary light reflector. That is, when some of light traveling towards a region at which the second type contact layer 141 is not formed is directed to a region at which the second type barrier layer 143 is disposed, the second type barrier layer 143 may also reflect the light. Accordingly, the second type barrier layer 143 can prevent foreign impurities from penetrating into the second type contact layer 141 and may include a material having light reflectivity. The second type barrier layer 143 may include at least one material selected from the group consisting of Au, Ni, Ti, W, Pt, Cu, Pd, Ta, and Cr. The second type barrier layer 143 may be composed of a single layer or multiple layers.

Figure 4A:
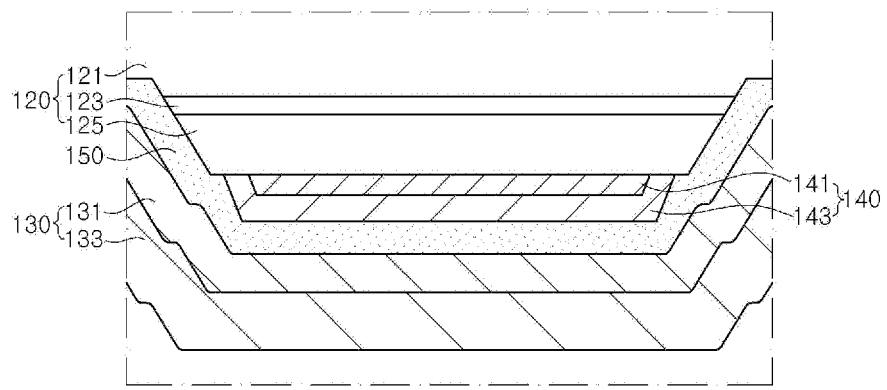
FIG. 4A, FIG. 4B, and FIG. 4C are enlarged sectional views a second type barrier layer according to exemplary embodiments of the present disclosure.
Figure 4B:
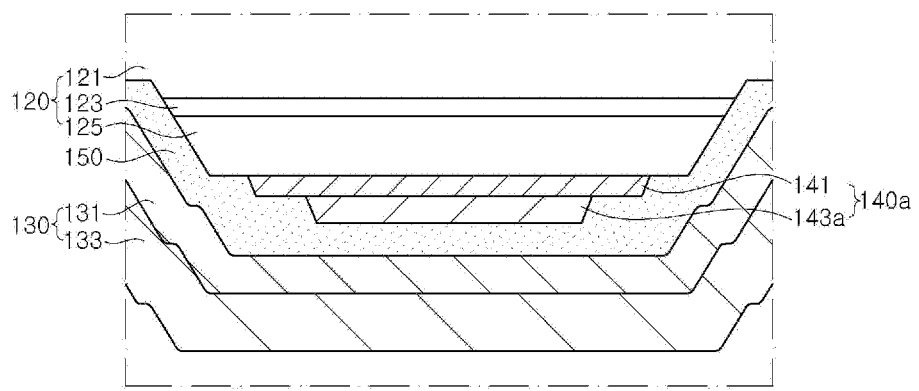
Figure 4C:
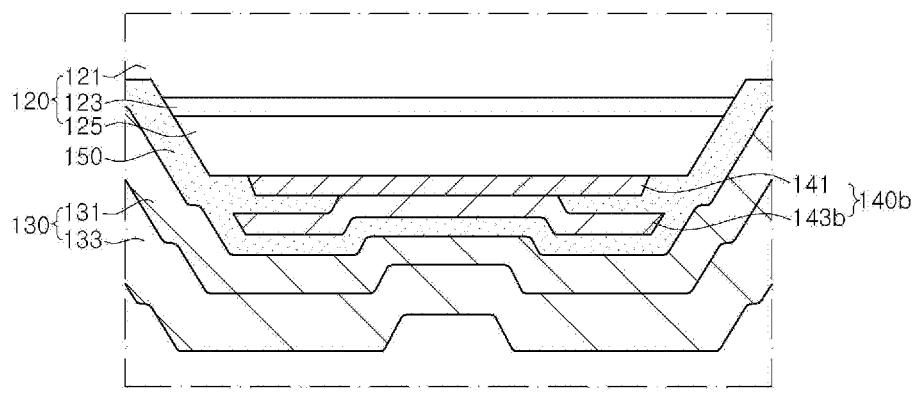

The second type barrier layer 143 may cover the second type contact layer 141 in various shapes, which will not be described together with various exemplary embodiments with reference to FIG. 4A, FIG. 4B, and FIG. 4C.

FIG. 4A, FIG. 4B, and FIG. 4C are enlarged sectional views a second type barrier layer according to exemplary embodiments of the present disclosure. FIG. 4A, FIG. 4B, and FIG. 4C are each a sectional view of Region A of FIG. 2B.

First, referring to FIG. 4A, the second type barrier layer 143 may completely cover the second type contact layer 141, as shown in FIG. 2B. Thus, a portion of the second type contact layer 141 may contact the second conductive type semiconductor layer 125.

Next, referring to FIG. 4B, the second type barrier layer 143a may be disposed only on some portion of a lower surface of the second type contact layer 141, whereby some portion of the second type contact layer 141 may be covered by the insulation layer 150 described below. In this exemplary embodiment, the second type barrier layer 143a and the insulation layer 150 prevent external impurities from diffusing into the second type contact layer 141. According to this exemplary embodiment, it is possible to prevent the second type barrier layer 143a from being peeled off due to deterioration in adhesion at a contact portion between the second type barrier layer 143a and the second conductive type semiconductor layer 125. As such, this structure prevents the second type barrier layer 143a from being peeled off, thereby more effectively preventing external impurities from penetrating into the second type contact layer 141 at an interface between the second conductive type semiconductor layer 125 and the second type barrier layer 143a.

Referring again to FIG. 4C, the second type barrier layer 143b covers some portion of the lower surface of the second type contact layer 141 and other portions of the lower surface of the second type contact layer 141 not covered by the second type barrier layer 143b may be covered by the insulation layer 150. In addition, the second type barrier layer 143b may further cover the insulation layer 150 such that at least some portion of the insulation layer 150 covering the second type contact layer 141 may be interposed between the second type contact layer 141 and the second type barrier layer 143b. That is, the second type barrier layer 143b and the insulation layer 150 may be formed to mesh with each other. As such, since the second type barrier layer 143b is fitted into the insulation layer 150, this structure can more effectively prevent external impurities from penetrating into the second type contact layer 141 due to peeling off of the second type barrier layer 143b.

Referring again to FIG. 1 and FIGS. 2A and 2B, a portion of the second type barrier layer 143 may extend from the side surface of the light emitting structure 120 to be exposed and the exposed portion of the second type barrier layer 143 may be electrically connected to the second type pad electrode 173. This structure will be described in detail below.

The insulation layer 150 may be disposed under the light emitting structure 120 and may cover the second type electrode 140. In addition, the insulation layer 150 may cover the side surface of the groove 120h and may include at least one opening placed corresponding to the groove 120h so as to expose a portion of the first conductive type semiconductor layer 121. Accordingly, a portion of a lower surface of the first conductive type semiconductor layer 121 can be exposed through the opening without being covered by the insulation layer 150.

The insulation layer 150 may be interposed between the first type electrode 130 and the second type electrode 140, and may insulate the first type and second type electrodes 130, 140 from each other. Accordingly, the insulation layer 150 may include an insulating material, for example, $SiO_2$ or $SiN_x$. Furthermore, the insulation layer 150 may be composed of multiple layers and may include a distributed Bragg reflector in which materials having different indices of refraction are alternately stacked one above another. In the structure wherein the insulation layer 150 includes a distributed Bragg reflector, light directed to a lower side of the light emitting diode is more effectively reflected, thereby further improving luminous efficacy of the light emitting diode.

The first type electrode 130 may be disposed under the insulation layer 150 and the light emitting structure 120, and may cover a lower surface of the insulation layer 150. The first electrode 130 may be electrically connected to the first conductive type semiconductor layer 121 through the opening of the insulation layer 150 disposed corresponding to the groove 120h.

The first type electrode 130 may include a first type contact layer 131 and a first type barrier layer 133, which may at least partially cover the first type contact layer 131. In this structure, as shown in FIGS. 2A and 2B, the first type contact layer 131 may be interposed between the first type barrier layer 133 and the insulation layer 150, and the first type contact layer 131 may contact the first conductive type semiconductor layer 121 through the opening of the insulation layer 150. The first type barrier layer 133 is formed to at least partially cover the first type contact layer 131, thereby preventing diffusion of some impurities from the bonding layer 160 to the first type contact layer 131.

Figure 5A:
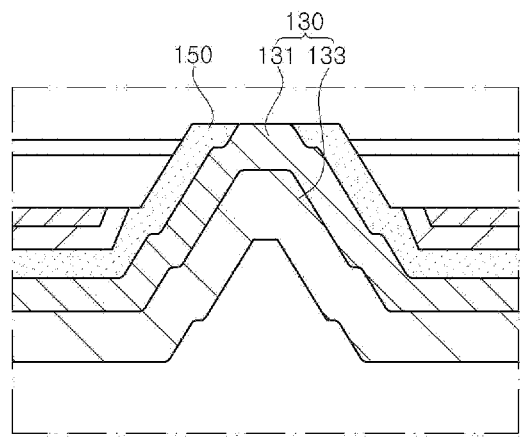
FIG. 5A and FIG. 5B are enlarged sectional views of a first type electrode according to exemplary embodiments of the present disclosure.
Figure 5B:
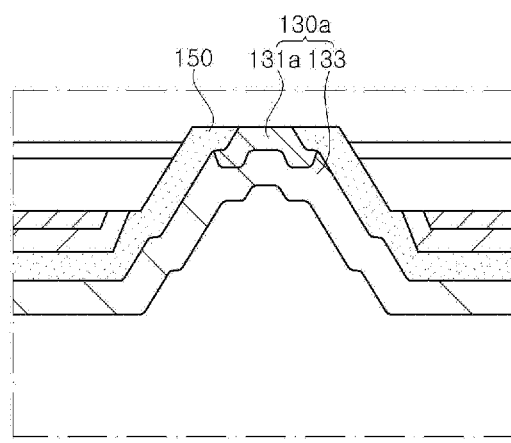

The following description is given of the shape and arrangement of the first type contact layer 131 according to some exemplary embodiments with reference to FIG. 5A and FIG. 5B. FIG. 5A and FIG. 5B are enlarged sectional views showing contact between the first conductive type semiconductor layer 121 and the first type electrode 130 according to exemplary embodiments of the present disclosure. FIG. 5A and FIG. 5B are enlarged sectional views of Region B of FIG. 2B.

First, referring to FIG. 5A, the first type contact layer 131 may be formed to cover the lower surface of the insulation layer 150, as shown in FIGS. 2A and 2B, and may cover the insulation layer 150 formed on the side surface of the groove 120h. In addition, the first type contact layer 131 may fill the opening of the insulation layer 150 disposed corresponding to the groove 120h to contact the first conductive type semiconductor layer 121. Accordingly, the first type barrier layer 133 does not directly contact the insulation layer 150. In this structure, the first type contact layer 131 may also act to reflect light. For example, the first type contact layer 131 may reflect light, which is emitted from the light emitting structure 120 and is directed towards the surface of the groove 120h instead of being directed towards the second type electrode 140, in an upward direction.

Alternatively, as shown in FIG. 5B, the first type contact layer 131a may be formed at a location of the groove 120h to contact the first conductive type semiconductor layer 121 by filling the opening of the insulation layer 150 and may not be disposed on the lower surface of the second conductive type semiconductor layer 125. That is, the first type contact layer 131a fills the opening of the insulation layer 150 to form ohmic contact with the first conductive type semiconductor layer 121 to electrically connect the first type barrier layer 133 and the first conductive type semiconductor layer 121. At this time, the first type barrier layer 133 may cover the first type contact layer 131a and the lower surface of the insulation layer 150. Accordingly, in this exemplary embodiment, light, which is emitted from the light emitting structure 120 and directed towards the surface of the groove 120h instead of being directed towards the second type electrode 140, may be reflected upward through the first type barrier layer 133.

It should be understood that the first type electrode 130 according to the present disclosure is not limited thereto.

As described above, the first type contact layer 131 may form ohmic contact with the first conductive type semiconductor layer 121 and may also act to reflect light. Accordingly, the first type contact layer 131 may be composed of a single layer or multiple layers. The first type contact layer 131 may include at least one stack structure of the group consisting of Ti/Al, Ni/Al, Cr/Al, and Pt/Al. The first type contact layer 131 may further include Ni, W, Pt, Cu, Ti, Pd, Ta, Au and the like in order to prevent aggregation of Al. In addition, the first type contact layer 131 may include a conductive oxide such as ITO.

The first type barrier layer 133 can prevent external impurities from diffusing into the first type contact layer 131, and may be electrically connected to the first type contact layer 131 and may also act to reflect light. Accordingly, the first type barrier layer 133 may be composed of a single layer or multiple layers, and may include Ni, W, Pt, Cu, Ti, Pd, Ta, Au, and the like.

The support substrate 171 may be disposed under the light emitting structure 120 and may be bonded to the first type electrode 130 through the bonding layer 160. The support substrate 171 may be a conductive substrate, a circuit substrate, or an insulating substrate having a conductive pattern formed thereon. In this exemplary embodiment, the supporting substrate 171 may be a metal substrate and may include, for example, a structure in which a Mo layer and a Cu layer are stacked. The support substrate 171 may include Ti, Cr, Ni, Al, Cu, Ag, Au, Pt, and the like.

The support substrate 171 may be electrically connected to the first type electrode 130 to act as a first type pad electrode that supplies external power to the first conductive type semiconductor layer 121 of the light emitting structure 120. For example, when the light emitting diode according to this exemplary embodiment is applied to various applications, the support substrate 171 is electrically connected to a structure such as an external lead electrode, thereby providing an electric path for supplying external power to the light emitting diode.

The bonding layer 160 is interposed between the first type electrode 130 and the support substrate 171 to bond the first type electrode 130 and the support substrate 171. The bonding layer 160 may include a conductive material and may include a material, such as AuSn, NiSn, InSn, NiAu, InAu, CuSn, and the like. For example, when the bonding layer 160 includes AuSn, Au and Sn can form a eutectic structure through eutectic bonding.

The second type pad electrode 173 may be spaced apart from the side surface of the light emitting structure 120 and may be disposed on a region to which the second type barrier layer 143 is exposed.

Figure 6A:
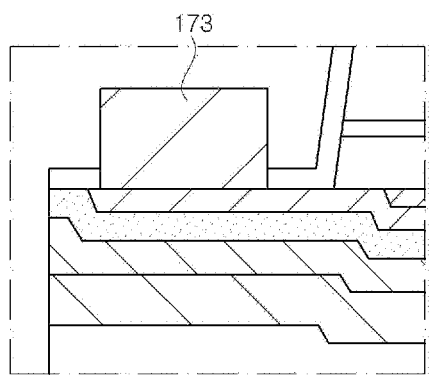
FIG. 6A and FIG. 6B are enlarged sectional views of a second type pad electrode according to exemplary embodiments of the present disclosure.
Figure 6B:
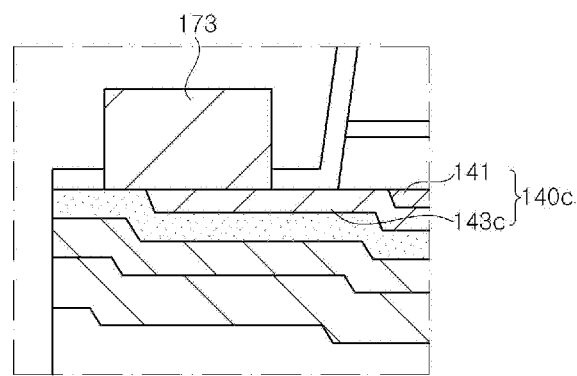

At least part of a lower surface of the second type pad electrode 173 may contact the second type barrier layer 143 to be electrically connected thereto. For example, as shown in FIG. 6A, the entire lower surface of the second type pad electrode 173 may contact the second type barrier layer 143. Alternatively, only a portion of the lower surface of the second type pad electrode 173 may contact the second type barrier layer 143c, and the remaining portion thereof may contact the insulation layer 150, as shown in FIG. 6B. Here, an upper surface of the insulation layer 150 of the exposed portion and an upper surface of the second type barrier layer 143 may not be coplanar with each other to form a step on the surface of the exposed portion. The second type pad electrode 173 may be disposed on such a step and may be prevented from being peeled off due to the step on the lower surface thereof.

The passivation layer 180 may cover the upper surface and the side surface of the light emitting structure 120. In addition, the passivation layer 180 may partially cover a side surface of the second pad electrode 173. The passivation layer 180 may protect the light emitting structure 120 from the outside and may also have a surface with a gentler inclination than the slope of the roughness 120R on the upper surface of the first conductive type semiconductor layer 121. With this structure, the light emitting diode can improve light extraction efficiency on the upper surface of the light emitting structure 120. The passivation layer 180 may include a light transmitting insulating material, for example, $SiO_2$.

The light emitting diode according to the exemplary embodiments includes the light emitting structure 120 having a non-polar or semi-polar growth plane to improve luminous efficacy and further includes the second type contact layer including the ohmic contact layer and the reflective layer to reduce contact resistance between the second type electrode and the second conductive type semiconductor layer having a non-polar or semi-polar growth plane.

Figure 7:
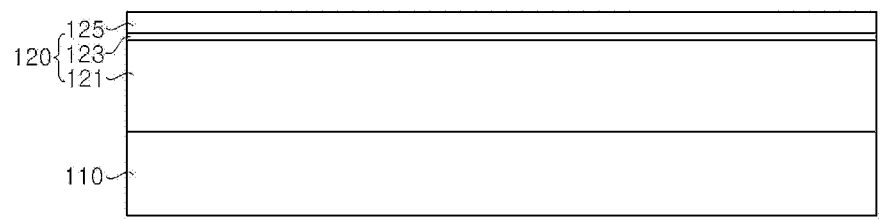
FIG. 7, FIG. 8B, FIG. 9, FIG. 10, FIG. 11, FIG. 12, FIG. 13, and FIG. 14 are sectional views illustrating a method of manufacturing a light emitting diode according to another exemplary embodiment of the present disclosure.
Figure 8A:
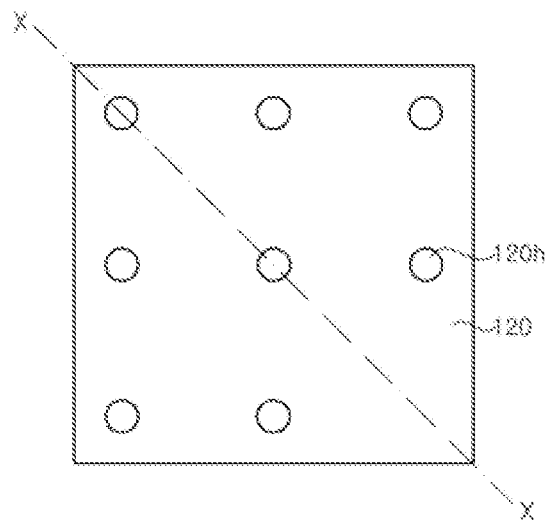
FIG. 8A is a plan view of the light emitting diode shown in FIG. 8B.
Figure 8B:
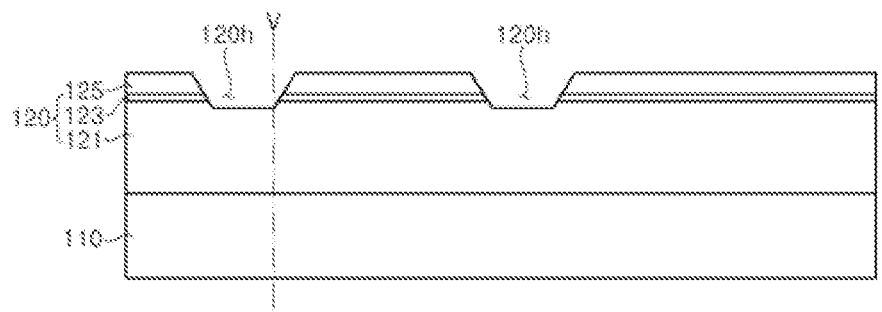

FIG. 7, FIG. 8B, FIG. 9, FIG. 10, FIG. 11, FIG. 12, FIG. 13, and FIG. 14 are sectional views illustrating a method of manufacturing a light emitting diode according to another exemplary embodiment of the present disclosure. FIG. 8A is a plan view of the light emitting diode shown in FIG. 8B. Specifically, FIG. 8B is a cross-sectional view taken along line X-X of FIG. 8A. In descriptions of this exemplary embodiment, the same components as those of the light emitting diode described with reference to FIGS. 1, 2A, 2B, 3A, 3B, 3C, 3D, 3E, 3F, 4A, 4B, 4C, 5A, 5B, 6A, and 6B will be denoted by the same reference numeral and repeated descriptions thereof will be omitted.

First, referring to FIG. 7, a light emitting structure 120 including a first conductive type semiconductor layer 121, an active layer 123, and a second conductive type semiconductor layer 125 is formed on a growth substrate 110 having a non-polar or semi-polar growth plane.

The growth substrate 110 may be selected from any substrates having a non-polar or semi-polar growth plane and allowing the light emitting structure 120 to be grown thereon, and may be, for example, a sapphire substrate, a silicon carbide substrate, a silicon substrate, a gallium nitride substrate, or an aluminum nitride substrate. For example, the growth substrate 110 may be a nitride substrate having the m-plane, the a-plane, or a semi-polar plane as the growth plane. Here, the growth plane may be tilted at an offset angle from a specific crystal plane.

The first conductive type semiconductor layer 121, the active layer 123, and the second conductive type semiconductor layer 125 may include a Group III-V compound semiconductor, for example, a nitride semiconductor such as (Al, Ga, In)N. The first conductive type semiconductor layer 121 may include an n-type semiconductor layer doped with n-type dopants (for example, Si) and the second conductive type semiconductor layer 125 may include a p-type semiconductor layer doped with p-type dopants (for example, Mg), or vice versa. The active layer 123 may include a multi-quantum well (MQW) structure.

The first conductive type semiconductor layer 121, the active layer 123, and the second conductive type semiconductor layer 125 may be grown on the growth substrate 110 by a technique such as metal organic chemical vapor deposition (MOCVD), molecular beam epitaxy (MBE), or hydride vapor phase epitaxy (HVPE). In particular, as the light emitting structure 120 is grown on the growth substrate 110 having a non-polar or semi-polar growth plane, the light emitting structure 120 is grown in a normal direction to the non-polar or semi-polar growth plane. Therefore, in the grown light emitting structure 120, spontaneous polarization is not formed in a direction in which electrons and holes recombine, thereby improving internal quantum efficiency.

Figure 9:
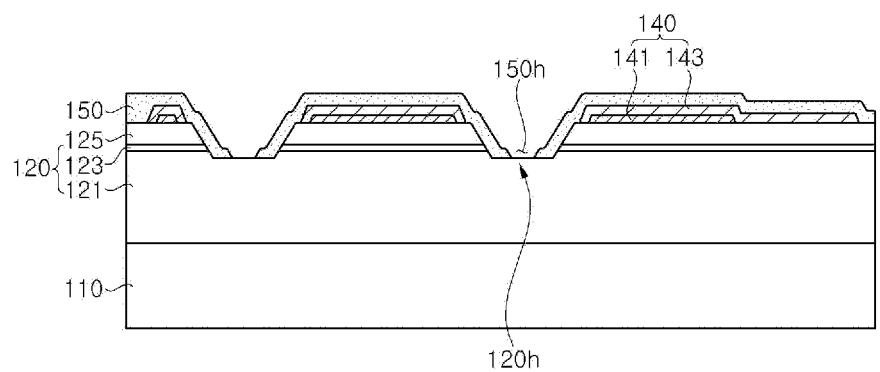

Next, referring to FIGS. 8A, 8B, and 9, at least one groove 120h partially exposing the first conductive type semiconductor layer 121 is formed by partially removing the light emitting structure 120, while forming the second type electrode 140 on the second conductive type semiconductor layer 125. In addition, an insulation layer 150 covering the second type electrode 140 may be further formed on the light emitting structure 120. Although the second type electrode 140 is illustrated as being formed after formation of the at least one groove 120h in this exemplary embodiment, it should be understood that the order of forming the at least one groove 120h and the second type electrode 140 is not particularly limited.

First, referring to FIGS. 8A and 8B, the light emitting structure 120 may be patterned through photolithography and etching. By this process, the at least one groove 120h can be formed to have an inclined side surface by reflow of a photoresist in the photolithography and etching process. That is, as shown in FIGS. 8A and 8B, the side surface of the groove 120h may have a slope inclined at a predetermined angle with respect to a virtual line V perpendicular to the lower surface of the light emitting structure 120. With the structure wherein the side surface of the groove 120h is inclined, step coverage of the insulation layer 150 and the first type electrode 130 formed in the subsequent processes described below can be improved.

As shown in FIG. 8A, the grooves 120h may be formed in plural and may be arranged at constant intervals. However, it should be understood that other implementations are also possible.

Referring to FIG. 9, a second type electrode 140 is formed on the second conductive type semiconductor layer 125, and an insulation layer 150 having an opening 150h partially exposing the first conductive type semiconductor layer 121 may be formed to cover the second type electrode 140 and an upper surface of the light emitting structure 120.

Forming the second type electrode 140 may include forming a second type contact layer 141 and forming a second type barrier layer 143 covering the second type contact layer 141. On the other hand, the second type electrode 140 may be formed such that only the second type barrier layer 143 can be located in a region in which a second type pad electrode 173 will be formed by the subsequent process. That is, only the second type barrier layer 143 may be formed in a region, to which the second type electrode 140 will be exposed by partially etching the light emitting structure 120 in the subsequent process, such that the second type contact layer 141 is not exposed through the region.

Forming the second type contact layer 141 may include forming an ohmic contact layer contacting the second conductive type semiconductor layer 125, and forming a reflective layer covering the ohmic contact layer. The structures of the ohmic contact layer and the reflective layer are substantially similar to those described with reference to FIGS. 3A, 3B, 3C, 3D, 3E, and 3F.

As described with reference to FIGS. 3A, 3B, 3C, 3D, 3E, and 3F, the ohmic contact layer may be formed by forming at least one material selected from the group consisting of Ni, Pt, Mg, Ni/Au, and a conductive oxide on the second conductive type semiconductor layer 125 through deposition or the like. Here, the ohmic contact layer may be formed in a film shape or in a pattern of plural islands on the second conductive type semiconductor layer 125. For example, the ohmic contact layer may be formed in a film shape by forming at least one material selected from the group consisting of Ni, Pt, Mg, Ni/Au, and the conductive oxide on the second conductive type semiconductor layer 125 through e-beam evaporation, as shown in FIGS. 3E and F, and may also be formed in a pattern of multiple islands regularly arranged thereon by patterning the film-shaped ohmic contact layer, as shown in FIGS. 3A and 3B. On the other hand, when the ohmic contact layer is irregularly formed on the second conductive type semiconductor layer 125 through adjustment of process conditions for deposition, the ohmic contact layer may have a shape, as shown in FIGS. 3C and 3D. However, it should be understood that other implementations are also possible. The reflective layer may be formed to cover the ohmic contact layer through deposition or plating of Ag and/or Al.

Further, forming the second type electrode 140 may further include heat treating the second type contact layer 141 after forming the second type contact layer 141 on the second conductive type semiconductor layer 125. The heat treatment may be performed at a relatively low temperature (for example, at about 500° C. or less) and can prevent deterioration in reflectance of the second type contact layer 141. Furthermore, in the method of manufacturing a light emitting diode according to this exemplary embodiment, since the second type contact layer 141 includes the ohmic contact layer and thus contact resistance between the second type contact layer 141 and the second conductive type semiconductor layer 125 can be sufficiently low, it is possible to omit the heat treatment process.

The second type barrier layer 143 may be formed to cover at least part of the second type contact layer 141 by depositing and/or plating a material selected from the group consisting of Au, Ni, Ti, W, Pt, Cu, Pd, Ta, Cr, and some combination thereof on the second type contact layer 141. The second type barrier layer 143 may have a shape, as shown in FIGS. 4A, 4B, and 4C. In particular, when the second type barrier layer 143 is formed as shown in FIG. 4C, the second type barrier layer 143 may be formed on the second type contact layer 141 after a portion of the insulation layer 150 is formed. That is, when the second type barrier layer 143 is formed as shown in FIG. 4C, formation of the second type electrode 140 may be achieved by first forming the insulation layer 150 that partially exposes the second type contact layer 141, forming the second type barrier layer 143 that partially covers the insulation layer 150 while contacting the exposed second type contact layer 141, and additionally forming the insulation layer 150 so as to cover the second type barrier layer 143.

The insulation layer 150 may be formed to cover the light emitting structure 120 and the second type electrode 140 through a deposition process such as e-beam evaporation, thermal deposition, or sputtering using a material comprising $SiO_2$ or $SiN_x$. Furthermore, at least one opening 150h may be formed in the insulation layer 150 at a location corresponding to the at least one groove 120h so as to expose the first conductive type semiconductor layer 121 by patterning the insulation layer 150. Alternatively, the insulation layer 150 including the opening 150h may be formed by deposition and lift-off. On the other hand, dielectric layers having different indices of refraction may be repeatedly stacked one above another to form the insulation layer 150 including a distributed Bragg reflector.

Figure 10:
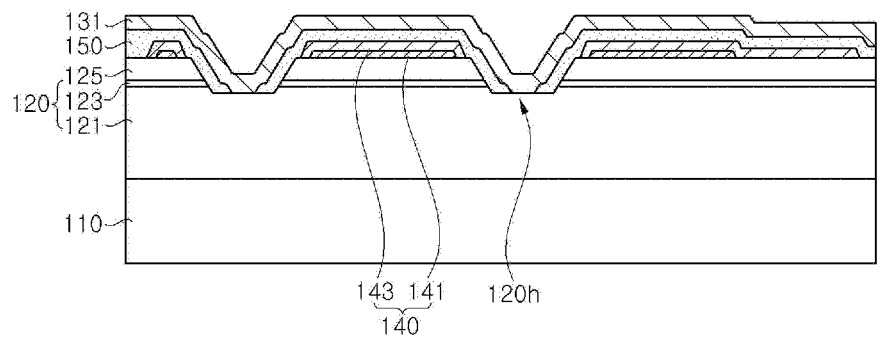
Figure 11:
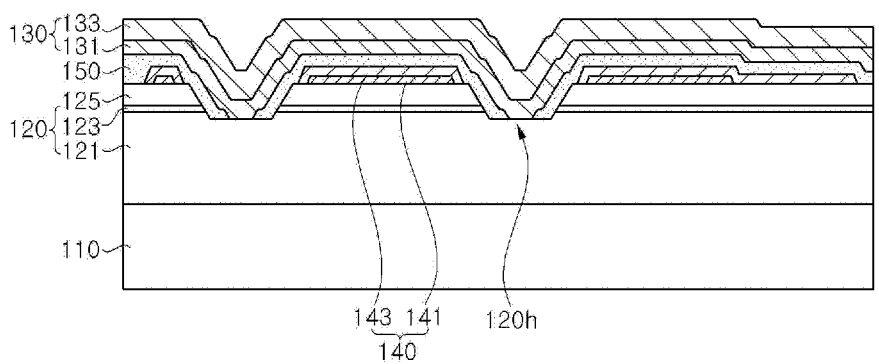

Next, referring to FIG. 10 and FIG. 11, a first type electrode 130 is formed to be electrically connected to the first conductive type semiconductor layer 121 through the opening 150h while partially covering the insulation layer 150. Forming the first type electrode 130 may include forming a first type contact layer 131 and a first type barrier layer 133.

First, referring to FIG. 10, the first type contact layer 131 may be formed to contact the first conductive type semiconductor layer 121 by filling the opening 150h. The first type contact layer 131 may be formed by forming at least one stack structure selected from the group consisting of Ti/Al, Ni/Al, Cr/Al, and Pt/Al through deposition and/or plating, and forming the first type contact layer 131 may further include depositing or plating a material comprising Ni, W, Pt, Cu, Ti, Pd, Ta, Au, and the like. The first type contact layer 131 and the first type barrier layer 133 may be continuously formed.

The first type contact layer 131 may be formed to cover the entire upper surface of the insulation layer 150, as shown in FIG. 10. Alternatively, the first type contact layer 131 may be partially formed around the opening 150h while filling the opening 150h. In this case, the first type contact layer 131 may be formed as shown in FIG. 5B to be located at a desired location through patterning or lift-off. In this case, since the first type contact layer 131 is formed at a particular location, the first type contact layer 131 and the first type barrier layer 133 may be intermittently formed.

Then, referring to FIG. 11, the first type barrier layer 133 may be formed to cover the first type contact layer 131. The first type barrier layer 133 may be formed through deposition and/or plating a material comprising Ni, W, Pt, Cu, Ti, Pd, Ta, Au or the like in a single layer or multiple layers.

Figure 12:
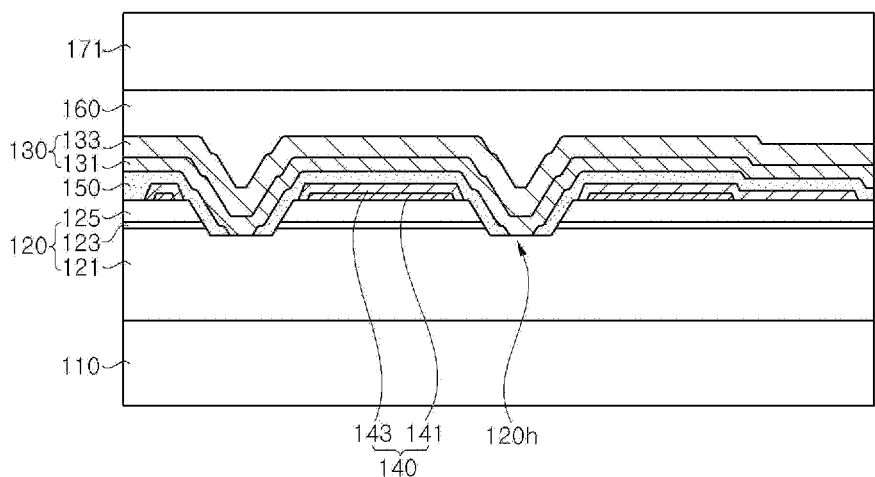

Referring to FIG. 12, the support substrate 171 is formed on the light emitting structure 120 and a bonding layer 160 may be further formed to bond the support substrate 171 and the first type electrode 130.

The bonding layer 160 may be interposed between the support substrate 171 and the first type electrode 130 to bond the support substrate 171 and the first type electrode 130. The bonding layer 160 may be formed on the first type electrode 130 before formation of the support substrate 171 and may be formed of any material capable of electrically connecting the support substrate 171 to the first type electrode 130 while bonding the same. For example, the bonding layer 160 may be formed by eutectic bonding, which may be achieved by depositing AuSn or the like on the first type electrode 130, heating the material to an AuSn eutectic temperature (about 280° C.) or more (for example, about 350° C.), and cooling AuSn.

Figure 13:
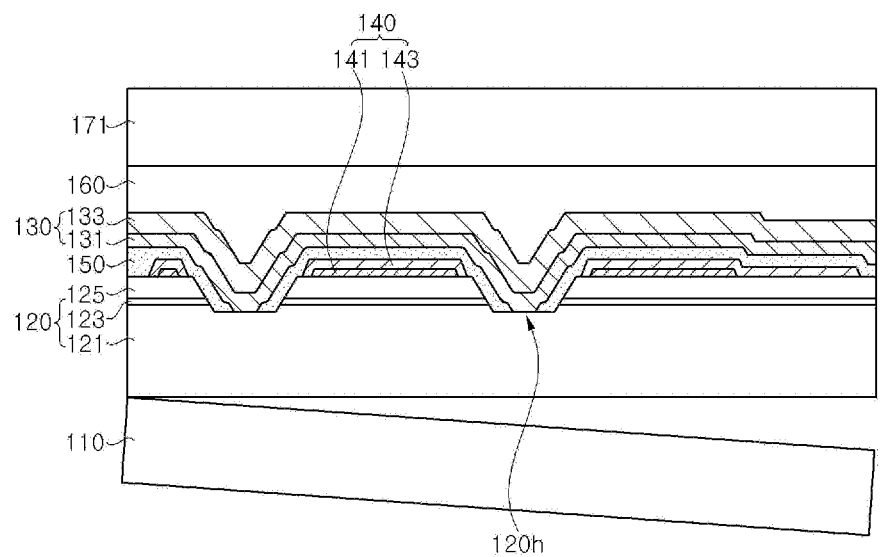

Next, referring to FIG. 13, the growth substrate 110 is separated from the light emitting structure 120. In addition, the method of manufacturing a light emitting diode according to this exemplary embodiment may further include forming roughness 120R on the first conductive type semiconductor layer 121 by increasing surface roughness of the first conductive type semiconductor layer 121 exposed by separation of the growth substrate 110.

The growth substrate 110 may be removed therefrom by various methods, for example, laser lift-off, chemical lift-off, or stress lift-off. According to the method of removing the growth substrate 110, additional layers may be interposed between the light emitting structure 120 and the growth substrate 110. For example, when the growth substrate 110 is a nitride substrate, the material of which is the same as the material of the light emitting structure 120, a sacrificial layer (not shown) may be further interposed between the growth substrate 110 and the light emitting structure 120. In this example, the growth substrate 110 may be removed from the light emitting structure 120 by removing a portion of the sacrificial layer or by applying stress to the sacrificial layer. However, it should be understood that other implementations are also possible. Furthermore, after removing the growth substrate 110 from the light emitting structure 120, the method may further include dicing the first conductive type semiconductor layer 121 to a constant thickness.

Forming the roughness 120R by increasing surface roughness of the first conductive type semiconductor layer 121 exposed by separation of the growth substrate 110 may include wet etching, dry etching, or electrochemical etching. Particularly, in this exemplary embodiment, since the exposed surface of the first conductive type semiconductor layer 121 is a non-polar or semi-polar plane, the roughness 120R may be formed by dry etching.

In the manufacturing method according to this exemplary embodiment, since the first conductive type semiconductor layer 121 can have a low defect density and the surface of the first conductive type semiconductor layer 121 exposed by separation of the growth substrate 110 has substantially no polarity, it is difficult to form the roughness 120R only through wet etching. Thus, the roughness 120R may be effectively formed on the surface of the first conductive type semiconductor layer 121 by dry etching or a combination of dry etching and wet etching.

Figure 14:
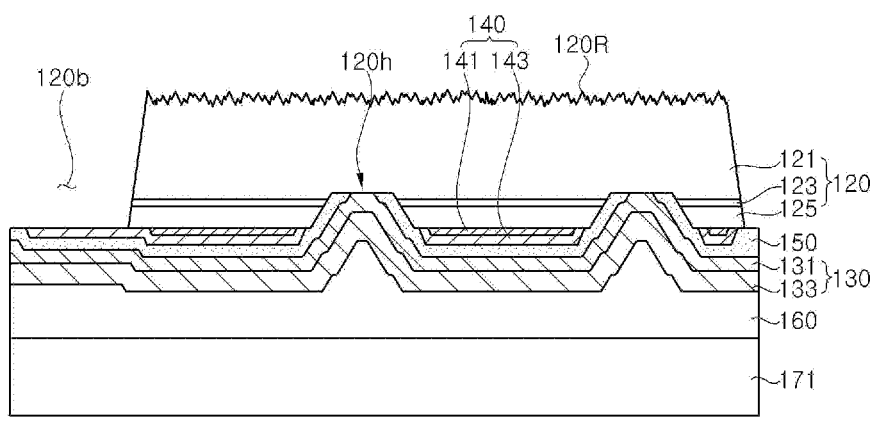

Next, referring to FIG. 14, the second type barrier layer 143 may be partially exposed by removing a portion of the light emitting structure 120 to form a region 120b. Then, a second type pad electrode 173 is formed on the region 120b, followed by forming a passivation layer 180, thereby providing a light emitting diode, as shown in FIGS. 2A and 2B.

The second type pad electrode 173 may be formed by deposition and lift-off such that a lower surface of the second type pad electrode 173 contacts at least part of the second type barrier layer 143. The passivation layer 180 may be formed to cover the light emitting structure 120 through deposition using a material comprising $SiO_2$ or $SiN_x$.

This exemplary embodiment provides a method of manufacturing a light emitting diode having good electrical and optical characteristics.

FIG. 15A and FIG. 15B are plan views of a light emitting diode according to another exemplary embodiment of the present disclosure. FIG. 16 is a sectional view taken along line Y-Y' of FIG. 15A. FIG. 15A is a plan view of the light emitting diode according to this exemplary embodiment. FIG. 15B is a plan view illustrating locations of grooves 120h and first and second openings 153a, 153b.

The light emitting diode according to this exemplary embodiment is different from the light emitting diode according to the above exemplary embodiments excluding the structures of the light emitting structure 120 and the pad electrodes 211, 213. The following description will mainly focus on different features of the light emitting diode according to this exemplary embodiment and detailed descriptions of the same features will be omitted.

Referring to FIGS. 15A, 15B, and 16, the light emitting diode according to this exemplary embodiment includes a light emitting structure 120, a first type electrode 130, a second type electrode 140, and insulation layers 151, 153. In addition, the light emitting diode may further include a growth substrate (not shown), a wavelength converter 220, and first and second electrode pads 211, 213.

The light emitting structure 120 includes a first conductive type semiconductor layer 121, an active layer 123, and a second conductive type semiconductor layer 125. The light emitting structure 120 may include at least one groove 120h formed through the second conductive type semiconductor layer 125 and the active layer 123 while partially exposing the first conductive type semiconductor layer 121.

The at least one groove 120h may be formed by partially removing the second conductive type semiconductor layer 125 and the active layer 123 and may be formed in plural, as shown in the drawings. Further, the second conductive type semiconductor layer 125 and the active layer 123 may be exposed to a side surface of the groove 120h, and the side surface of the groove 120h may be an inclined side surface. When the at least one groove 120h is composed of a plurality of grooves, the shape of the grooves 120h may be modified in various ways. Since the first type electrode 130 is electrically connected to the first conductive type semiconductor layer 121 through the grooves 120h, the arrangement of the grooves 120h may be modified in various ways in consideration of current dispersion and density of electric current upon driving of the light emitting diode. For example, the grooves 120h may be arranged in the form of plural dots, plural stripes, or combinations thereof. In this exemplary embodiment, the plural grooves 120h may be formed over the surface of the light emitting structure 120.

In some exemplary embodiments, the second electrode pad 213 may have a lower region free from the groove 120h. That is, as shown in FIG. 15B, the groove 120h may not be formed around the second opening 153b of the second insulation layer 153 for electrical connection between the second electrode pad 213 and the second type electrode 140. When the groove 120h is formed around a contact region between the second electrode pad 213 and the second type electrode 140, current crowding can occur in the first conductive type semiconductor layer 121 near the grooves 120h around the contact region, thereby causing deterioration in current spreading efficiency. Thus, in this exemplary embodiment, the groove 120h is not formed around the second opening 153b of the second insulation layer 153, particularly, under the second opening 153b, thereby improving current spreading efficiency.

The grooves 120h are substantially regularly arranged throughout the light emitting structure 120. However, it should be understood that other implementations are also possible and the arrangement and number of grooves 120h may be modified in various ways. In addition, the exposed shape of the first conductive type semiconductor layer 121 is not limited to the shape of the grooves 120h. For example, the first conductive type semiconductor layer 121 may be exposed in a line shape or a combination of hole and line shapes.

On the other hand, the light emitting structure 120 may be formed on a growth substrate having a non-polar or semi-polar growth plane. Thus, the light emitting structure 120 including the first conductive type semiconductor layer 121, the active layer 123, and the second conductive type semiconductor layer 125 may have a non-polar or semi-polar growth plane. The non-polar growth plane may include the m-plane or the a-plane.

The second type electrode 140 is disposed on the second conductive type semiconductor layer 125 to form ohmic contact with the second conductive type semiconductor layer 125. The second type electrode 140 may be disposed to cover an upper surface of the second conductive type semiconductor layer 125, or may be formed to cover substantially the entire upper surface of the second conductive type semiconductor layer 125. The second type electrode 140 may be formed as a monolithic layer throughout the light emitting structure 120. In this structure, the second type electrode 140 may include opening regions located corresponding to the plurality of grooves 120h. With this structure, the light emitting diode allows electric current to be supplied to the entirety of the light emitting structure 120, thereby improving current spreading efficiency.

The second type electrode 140 forming ohmic contact with the second conductive type semiconductor layer 125 having a non-polar or semi-polar growth plane may have the same structure as described in the above exemplary embodiments. Specifically, the second type electrode 140 may include a second type contact layer 141 and a second type barrier layer 143, and the structure of the second type electrode 140 described with reference to FIGS. 3A, 3B, 3C, 3D, 3E, and 3F may also be applied to this exemplary embodiment. Accordingly, the second type contact layer 141 may include an ohmic contact layer 1411 and a reflective layer 1413 covering the ohmic contact layer 1411. Further, as an example, the ohmic contact layer 1411 may include at least one material selected from the group consisting of Ni, Pt, Mg, Ni/Au, and a conductive oxide. Here, the conductive oxide may include ITO, IZO, IZTO, IAZO, IGZO, IGTO, AZO, IrOx, RuOx, RuOx/ITO, MgO, ZnO, and the like. In addition, the ohmic contact layer 1411 may be formed in a pattern of regularly arranged islands, a pattern of irregularly arranged islands, or a sheet (film) shape, in which the ohmic contact layer 1411 of each island shape may have a semispherical shape.

The insulation layers 151, 153 may partially cover the light emitting structure 120 and the second type electrode 140. The insulation layers 151, 153 can insulate the first type electrode 130 and the second type electrode 140 from each other. Further, the insulation layers 151, 153 may include a first insulation layer 151 and a second insulation layer 153.

The first insulation layer 151 may partially cover an upper surface of the light emitting structure 120 and the second type electrode 140. The first insulation layer 151 may cover side surfaces of the plurality of grooves 120h and may include openings partially exposing the first conductive type semiconductor layer 121 located on the lower surface of the grooves 120h. Thus, the openings may be disposed corresponding to arrangement of the plural grooves 120h. In addition, the first insulation layer 151 may include an opening exposing a portion of the second type electrode 140. Further, the first insulation layer 151 may further cover at least part of the side surface of the light emitting structure 120.

The first insulation layer 151 may be formed of an insulating material, for example, $SiO_2$ or $SiN_x$. Further, the upper insulation layer 153 may be composed of multiple layers and may include a distributed Bragg reflector in which materials having different indices of refraction are alternately stacked one above another.

The distributed Bragg reflector may be formed by repeatedly stacking dielectric layers having different indices of refraction and may have a structure of, for example, $TiO_2$/$SiO_2$ layers alternately stacked one above another. Each layer of the distributed Bragg reflector may have an optical thickness of ¼ of a specific wavelength and the distributed Bragg reflector may be composed of 4 to 20 pairs of layers. The distributed Bragg reflector may be formed at a lower side thereof with an underlying layer capable of improving film quality of the distributed Bragg reflector. For example, the first insulation layer 151 may include an underlying layer having a thickness of about 0.2 μm to about 1.0 μm and formed of $SiO_2$ and a distributed Bragg reflector formed on the underlying layer and having a structure in which $TiO_2$/$SiO_2$ layers are repeatedly stacked one above another in a predetermined number of cycles. However, it should be understood that other implementations are also possible and the distributed Bragg reflector may include dielectrics such as $ZrO_2$, $HfO_2$, and the like.

The distributed Bragg reflector may have a high visible light reflectance. The distributed Bragg reflector may be designed to have a reflectance of 90% or more for light having an incident angle of 0 to 60° and a wavelength of 400 nm to 700 nm. Within this range of reflectance, the distributed Bragg reflector may be provided by controlling the type, thickness, stacking period, and the like of a plurality of dielectric layers forming the distributed Bragg reflector. Accordingly, it is possible to form a distributed Bragg reflector having high reflectance with respect to light having a relatively long wavelength (for example, 550 nm to 700 nm) and light having a relatively short wavelength (for example, 400 nm to 550 nm).

The distributed Bragg reflector may include a multilayer structure so as to have high reflectance with respect to light in a broad wavelength band. That is, the distributed Bragg reflector may include a first stack structure in which dielectric layers having a first thickness are stacked and a second stack structure in which dielectric layers having a second thickness are stacked. For example, the distributed Bragg reflector may include a first stack structure in which dielectric layers having a thickness of less than ¼ of an optical thickness with respect to light at the center wavelength of visible light (about 550 nm) are stacked, and a second stack structure in which dielectric layers having a thickness of greater than ¼ of the optical thickness with respect to light at the center wavelength of visible light (about 550 nm) are stacked. The distributed Bragg reflector may further include a third stack structure in which a dielectric layer having a thickness of greater than ¼ of an optical thickness with respect to light at the center wavelength of visible light (about 550 nm) and a dielectric layer having a thickness of less than ¼ of an optical thickness with respect to light at the center wavelength of visible light (about 550 nm) are repeatedly stacked one above another.

With the distributed Bragg reflector of the first insulation layer 151 covering substantially the entirety of the upper surface of the light emitting structure 120, the light emitting diode can have improved luminous efficacy. Particularly, light escaping from the side surfaces of the grooves 120h not covered by the second type barrier layer 143 of the second type electrode 140 can be reflected by the distributed Bragg reflector of the first insulation layer 151, whereby the light emitting diode can have further improved luminous efficacy.

The first type electrode 130 may partially cover the light emitting structure 120 and may be disposed on the first insulation layer 151. The first type electrode 130 may form ohmic contact with the first conductive type semiconductor layer 121 through the grooves 120h and the openings of the first insulation layer 151 located corresponding to the grooves 120h. Alternatively, the first type electrode 130 may be formed to cover the side surface of the light emitting structure 120. In addition, the first type electrode 130 may include a first type contact layer 131 and a first type barrier layer 133.

The second insulation layer 153 may partially cover the first type electrode 130 and may have a first opening 153a partially exposing the first type electrode 130 and a second opening 153b partially exposing the second type electrode 140. Each of the first and second openings 153a, 153b may be formed in plural. In addition, the openings 153a, 153b may be biased to opposite side surfaces. The second insulation layer 153 may include an insulating material, for example, $SiO_2$, $SiN_x$, $MgF_2$, and the like. In some exemplary embodiments, the second insulation layer 153 may include a distributed Bragg reflector. In addition, when the second insulation layer 153 is composed of multiple layers, the uppermost layer of the second insulation layer 153 may be formed of $SiN_x$. The layer formed of $SiN_x$ has good moisture resistance to protect the light emitting diode from moisture.

The first electrode pad 211 and the second electrode pad 213 may be disposed on the light emitting structure 120 and may be electrically connected to the first type electrode 130 and the second type electrode 140, respectively. Unlike the exemplary embodiment of FIGS. 1, 2A, 2B, 3A, 3B, 3C, 3D, 3E, 3F, 4A, 4B, 4C, 5A, 5B, 6A, 6B, 7, 8A, 8B, 9, 10, 11, 12, 13, and 14, the first and second electrode pads 211, 213 of this exemplary embodiment may be disposed on the upper surface of the light emitting structure 120. Thus, the light emitting diode according to this exemplary embodiment may be flip-bonded through the first and second electrode pads 211, 213.

In various exemplary embodiments, the light emitting diode may further include a growth substrate (not shown). The growth substrate may be selected from any substrates having a non-polar or semi-polar growth plane and allowing the light emitting structure 120 to be grown thereon, and may be, for example, a sapphire substrate, a silicon carbide substrate, a silicon substrate, a gallium nitride substrate, or an aluminum nitride substrate. For example, the growth substrate may be a nitride substrate having the m-plane, the a-plane, or a semi-polar plane as the growth plane. Here, the growth plane may be tilted at an offset angle from a specific crystal plane. In the light emitting diode according to this exemplary embodiment, since the first and second electrode pads 211, 213 are disposed on the light emitting structure 120, the light emitting diode may be provided without separating the growth substrate from the light emitting structure 120. Further, the growth substrate may also act to support the light emitting structure 120.

The wavelength converter 220 may be disposed on the lower surface of the light emitting structure 120. With the wavelength converter 220, the light emitting diode can realize various colors through wavelength conversion of light emitted from the light emitting structure 120 through the wavelength converter 210. In addition, the wavelength converter 210 may extend to the side surface of the light emitting structure 120 as well as the lower surface of the light emitting structure 120 and may further extend to a side surface of an insulation support 280. In the structure wherein the light emitting diode further includes the growth substrate (not shown), the wavelength converter 220 may further cover a lower surface of the growth substrate. In this structure, the growth substrate may be interposed between the wavelength converter 220 and the light emitting structure 120.

The wavelength converter 220 may include a material capable of converting the wavelength of light. For example, the wavelength converter 220 may be provided in the form of phosphors dispersed in a carrier, in the form of a single crystal phosphor sheet, or in the form of a quantum dot-containing material. However, it should be understood that other implementations are also possible. As the light emitting diode includes the wavelength converter 220, a chip scale package capable of emitting white light can be provided.

Figure 17:
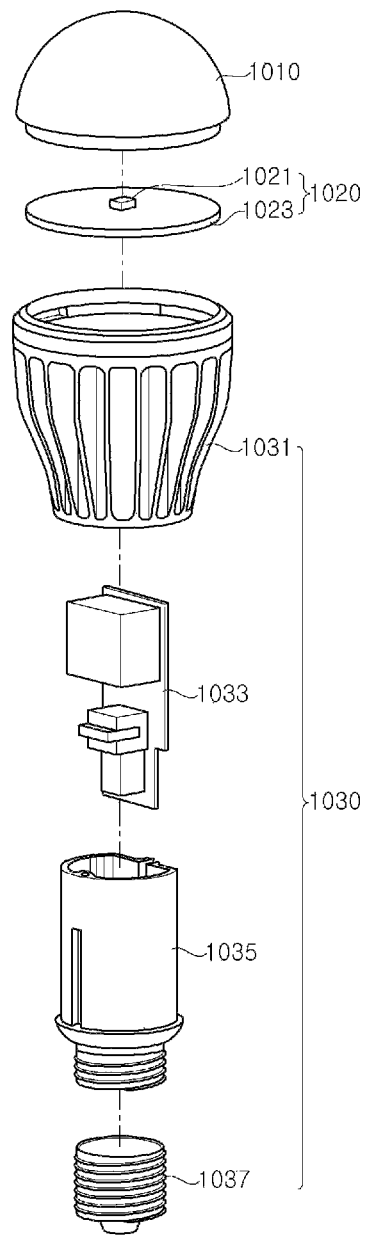
FIG. 17 is an exploded perspective view of one example of a lighting apparatus to which a light emitting element according to one exemplary embodiment of the present disclosure is applied.

FIG. 17 is an exploded perspective view of one example of a lighting apparatus to which a light emitting diode according to one exemplary embodiment of the present disclosure is applied.

Referring to FIG. 17, the lighting apparatus according to this exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 18:
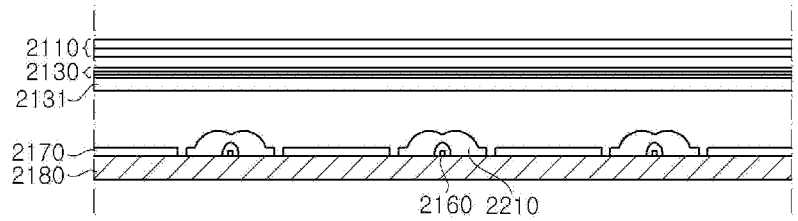
FIG. 18 is a cross-sectional view of one example of a display to which a light emitting diode according to one exemplary embodiment of the present disclosure is applied.

FIG. 18 is a cross-sectional view of one example of a display apparatus to which a light emitting diode according to one exemplary embodiment of the present disclosure is applied.

The display according to this exemplary embodiment includes a display panel 2110, a backlight unit supplying light to the display panel 2110, and a panel guide (not shown) supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module, which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive a substrate (not shown), the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the light source module may include a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting diode 2160. Light emitted from the light emitting diode 2160 may be supplied in the form of sheet light to the display panel 2110 through the diffusive plate 2131 and the optical sheets 2130.

In this way, the light emitting diodes according to the exemplary embodiments may be applied to direct type displays like the display according to this exemplary embodiment.

Figure 19:
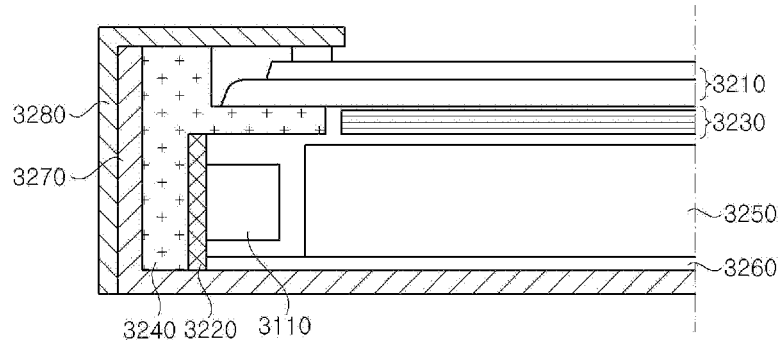
FIG. 19 is a cross-sectional view of another example of a display to which a light emitting diode according to one exemplary embodiment of the present disclosure is applied.

FIG. 19 is a cross-sectional view of another example of the display apparatus to which a light emitting diode according to one exemplary embodiment of the present disclosure is applied.

The display according to this exemplary embodiment includes a display panel 3210 on which an image is displayed, and a backlight unit disposed at a rear side of the display panel 3210 and emitting light thereto. Further, the display includes a frame (not shown) supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display according to this exemplary embodiment.

Figure 20:
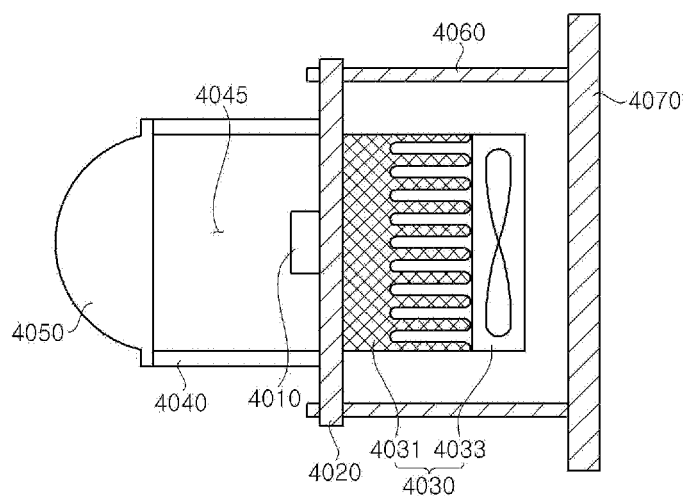
FIG. 20 is a cross-sectional view of a headlight to which a light emitting diode according to one exemplary embodiment of the present disclosure is applied.

FIG. 20 is a cross-sectional view of a headlight to which a light emitting diode according to one exemplary embodiment of the present disclosure is applied.

Referring to FIG. 20, the headlight according to this exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiment may be applied to headlights, particularly, headlights for vehicles, like the headlight according to this embodiment.

Although some exemplary embodiments have been described herein, it should be understood by those skilled in the art that these embodiments are given by way of illustration only, and that various modifications, variations and alterations can be made without departing from the spirit and scope of the present disclosure.

The invention claimed is:

1. A light emitting diode, comprising:
a support substrate;
a light emitting structure disposed on the support substrate and having an m-plane or an a-plane growth plane, the light emitting structure comprising a second conductive type semiconductor layer, an active layer disposed on the second conductive type semiconductor layer, and a first conductive type semiconductor layer disposed on the active layer;
at least one groove formed on a lower surface of the light emitting structure and partially exposing the first conductive type semiconductor layer;
a second type electrode disposed at least on a lower surface of the second conductive type semiconductor layer and electrically connected to the second conductive type semiconductor layer;
an insulation layer partially covering the second type electrode and the lower surface of the light emitting structure, and having at least one opening corresponding to the at least one groove; and
a first type electrode electrically connected to the first conductive type semiconductor layer exposed through the at least one groove and at least partially covering the insulation layer,
wherein the second type electrode comprises a second type contact layer contacting the second conductive type semiconductor layer, and the second type contact layer comprises an ohmic contact layer, the ohmic contact layer being composed of a plurality of islands,
wherein the first type electrode comprises a first type contact layer contacting the first conductive type semiconductor layer and a first type barrier layer at least partially covering the first type contact layer, and wherein the first type contact layer fills the at least one opening and is not disposed on the lower surface of the second conductive type semiconductor layer.

2. The light emitting diode according to claim 1, wherein the ohmic contact layer comprises at least one material selected from the group consisting of nickel (Ni), platinum (Pt), magnesium (Mg), nickel-gold (Ni/Au), and a conductive oxide.

3. The light emitting diode according to claim 1, wherein the second type contact layer further comprises a reflective layer covering the ohmic contact layer, the reflective layer comprising at least one material selected from the group consisting of silver (Ag) and aluminum (Al).

4. The light emitting diode according to claim 1, wherein the second type electrode further comprises a second type barrier layer at least partially covering the second type contact layer, and a portion of the second type barrier layer extends from one side surface of the light emitting structure to be exposed at an upper surface thereof.

5. The light emitting diode according to claim 4, wherein some portion of a lower surface of the second type contact layer is covered by the second type barrier layer and the other portion of the lower surface of the second type contact layer is covered by the insulation layer.

6. The light emitting diode according to claim 5, wherein at least part of a portion of the insulation layer covering the other portion of the lower surface of the second type contact layer is interposed between the second type barrier layer and the second type contact layer.

7. The light emitting diode according to claim 4, further comprising:
a second type pad electrode electrically connected to the second type barrier layer and formed in a region to which the upper surface of the portion of the second type barrier layer is exposed,
wherein a lower surface of the second type pad electrode at least partially contacts the second type barrier layer.

8. The light emitting diode according to claim 1, wherein the first type contact layer covers a lower surface of the insulation layer.

9. The light emitting diode according to claim 1, further comprising:
a bonding layer bonding the support substrate and the second type electrode to each other.

* * * * *